US006885562B2

(12) United States Patent
McIlnay et al.

(10) Patent No.: US 6,885,562 B2
(45) Date of Patent: Apr. 26, 2005

(54) CIRCUIT PACKAGE AND METHOD FOR MAKING THE SAME

(75) Inventors: Ronald G. McIlnay, Hansville, WA (US); Martin S. Abbbenhouse, Kirkland, WA (US)

(73) Assignee: Medtronic Physio-Control Manufacturing Corporation, Redmond, WA (US)

( * ) Notice: Subject to any disclaimer, the term of this patent is extended or adjusted under 35 U.S.C. 154(b) by 0 days.

(21) Appl. No.: 10/033,595

(22) Filed: Dec. 28, 2001

(65) Prior Publication Data

US 2003/0123240 A1 Jul. 3, 2003

(51) Int. Cl.[7] .............................................. H01R 9/00
(52) U.S. Cl. ...................................... 361/772; 361/801
(58) Field of Search .............................. 174/52.1–52.2, 174/260–262, 35 R; 361/801–802, 772, 760, 764, 781; 439/76.1; 29/840–846; 257/692

(56) References Cited

U.S. PATENT DOCUMENTS

| | | | |
|---|---|---|---|
| 3,566,876 A | | 3/1971 | Stoft |
| 3,814,105 A | | 6/1974 | Howard et al. |
| 4,119,903 A | | 10/1978 | Pirkle |
| 4,147,162 A | | 4/1979 | Gatzke |
| 4,164,215 A | | 8/1979 | Finlayson et al. |
| 4,233,659 A | | 11/1980 | Pirkle |
| 4,372,324 A | | 2/1983 | Rockwell |
| 4,619,431 A | * | 10/1986 | Matsui et al. ............... 248/500 |
| 4,650,267 A | * | 3/1987 | Yagi ............................ 439/78 |
| 4,682,270 A | | 7/1987 | Whitehead et al. |
| 4,813,642 A | * | 3/1989 | Matsui .................. 248/221.11 |
| 4,987,902 A | | 1/1991 | Couche |
| 4,990,720 A | | 2/1991 | Kaufman |
| 5,040,994 A | * | 8/1991 | Nakamoto et al. .......... 439/76.1 |
| 5,222,492 A | | 6/1993 | Morgan et al. |
| 5,225,769 A | | 7/1993 | Fincke et al. |
| 5,249,573 A | | 10/1993 | Fincke et al. |
| 5,275,157 A | | 1/1994 | Morgan et al. |
| 5,275,158 A | | 1/1994 | Lopin |
| 5,285,779 A | | 2/1994 | Cameron et al. |
| 5,295,045 A | * | 3/1994 | Kitano et al. ............... 361/813 |

(Continued)

FOREIGN PATENT DOCUMENTS

EP          0 767 495 B1     8/2000

OTHER PUBLICATIONS

IXYS Corporation, High Voltage IGBT Die, May 20, 2000.
IXYS Corporation, High Voltage H–Bridge Module V 9222, 2000.
IXYS Corporation, High Voltage H–Bridge Module V 9333, 2001.

Primary Examiner—Kamand Cuneo
Assistant Examiner—Tuan Dinh
(74) Attorney, Agent, or Firm—Ingrassia Fisher & Lorenz, P.C.

(57) ABSTRACT

A circuit package with improved heat dissipation properties for high-power circuits. In one embodiment, the circuit package comprises two circuit boards positioned in different planes, at least one brace affixed between the two circuit boards, a molded housing enclosing an area between the circuit boards, and a plurality of electrically conductive leads extending from the sides of the circuit package. The molded housing is configured to expose at least one surface of the circuit boards to the exterior surface of the circuit package. The leads are configured in a J-shape, which allows the circuit package to be mounted in an upright position. The brace functions as a flexible spacer for holding the two circuit boards in position during the application of the molded housing. In one embodiment, a H-bridge circuit is configured on the first and second circuit boards of the circuit package.

18 Claims, 11 Drawing Sheets

U.S. PATENT DOCUMENTS

| | | |
|---|---|---|
| 5,370,664 A | 12/1994 | Morgan et al. |
| 5,384,544 A | 1/1995 | Flugstad et al. |
| 5,395,394 A | 3/1995 | Cameron |
| 5,405,361 A | 4/1995 | Persson |
| 5,443,490 A | 8/1995 | Flugstad |
| 5,484,452 A | 1/1996 | Persson |
| 5,517,058 A | 5/1996 | Temple |
| 5,536,972 A | 7/1996 | Kato |
| 5,574,312 A | 11/1996 | Bayerer et al. |
| 5,601,610 A | 2/1997 | Persson |
| 5,616,955 A | 4/1997 | Yamada et al. |
| 5,620,465 A | 4/1997 | Olson et al. |
| 5,640,078 A | 6/1997 | Kou et al. |
| 5,643,324 A | 7/1997 | Persson |
| 5,650,662 A | 7/1997 | Edwards et al. |
| 5,674,266 A | 10/1997 | Stendahl |
| 5,722,995 A | 3/1998 | Olson et al. |
| 5,733,310 A | 3/1998 | Lopin et al. |
| 5,748,427 A | 5/1998 | Yerkovich et al. |
| 5,760,473 A | 6/1998 | Dickson et al. |
| 5,797,968 A | 8/1998 | Lopin et al. |
| 5,800,462 A | 9/1998 | Lopin et al. |
| 5,800,463 A | 9/1998 | Lopin et al. |
| 5,824,017 A | 10/1998 | Sullivan et al. |
| 5,836,972 A | 11/1998 | Stendahl et al. |
| 5,868,794 A | 2/1999 | Barkley et al. |
| 5,869,890 A | 2/1999 | Nishiura et al. |
| 5,873,893 A | 2/1999 | Sullivan et al. |
| 5,889,388 A | 3/1999 | Cameron et al. |
| 5,891,173 A | 4/1999 | Brewer |
| 5,892,279 A | 4/1999 | Nguyen |
| 5,897,576 A | 4/1999 | Olson et al. |
| 5,899,924 A | 5/1999 | Brewer et al. |
| 5,902,323 A | 5/1999 | Brewer et al. |
| 5,904,706 A | 5/1999 | Ayati et al. |
| 5,908,442 A | 6/1999 | Brewer et al. |
| 5,908,443 A | 6/1999 | Brewer et al. |
| 5,909,138 A | 6/1999 | Stendahl |
| 5,924,191 A | 7/1999 | Credle, Jr. et al. |
| 5,942,797 A | 8/1999 | Terasawa |
| 5,966,291 A | 10/1999 | Bäumel et al. |
| 5,968,080 A | 10/1999 | Brewer et al. |
| 5,978,706 A | 11/1999 | Brewer et al. |
| 5,982,031 A | 11/1999 | Stockmeier |
| 6,005,370 A | 12/1999 | Gustavson et al. |
| 6,021,349 A | 2/2000 | Arand et al. |
| 6,029,085 A | 2/2000 | Olson et al. |
| 6,031,730 A * | 2/2000 | Kroske ................. 361/784 |
| 6,038,473 A | 3/2000 | Olson et al. |
| 6,041,254 A | 3/2000 | Sullivan et al. |
| 6,054,765 A | 4/2000 | Eytcheson et al. |
| 6,088,616 A | 7/2000 | Olson et al. |
| 6,096,063 A | 8/2000 | Lopin et al. |
| 6,101,413 A | 8/2000 | Olson et al. |
| 6,104,953 A | 8/2000 | Leyde |
| 6,119,039 A | 9/2000 | Leyde |
| 6,128,530 A | 10/2000 | Galen et al. |
| 6,133,787 A | 10/2000 | Yerkovich et al. |
| 6,173,204 B1 | 1/2001 | Sullivan et al. |
| 6,175,765 B1 | 1/2001 | Sullivan et al. |
| 6,198,967 B1 | 3/2001 | Brewer et al. |
| 6,201,696 B1 | 3/2001 | Shimizu et al. |
| 6,208,895 B1 | 3/2001 | Sullivan et al. |
| 6,208,896 B1 | 3/2001 | Mulhauser |
| 6,208,898 B1 | 3/2001 | Gliner et al. |
| 6,223,077 B1 | 4/2001 | Schweizer et al. |
| 6,224,405 B1 * | 5/2001 | Eland ................. 439/160 |
| 6,230,054 B1 | 5/2001 | Powers |
| 6,241,751 B1 | 6/2001 | Morgan et al. |
| 6,253,105 B1 | 6/2001 | Leyde |
| 6,291,892 B1 | 9/2001 | Yamaguchi |
| 6,299,574 B1 | 10/2001 | Ochs et al. |
| 6,405,081 B1 | 6/2002 | Lyster et al. |
| 6,411,846 B1 | 6/2002 | Brewer et al. |
| 6,421,563 B1 | 7/2002 | Sullivan et al. |
| 6,466,452 B1 * | 10/2002 | Yamada et al. ............. 361/801 |
| 6,477,413 B1 | 11/2002 | Sullivan et al. |
| 6,539,258 B1 | 3/2003 | Sullivan et al. |
| 2001/0027330 A1 | 10/2001 | Sullivan et al. |
| 2002/0016140 A1 | 10/2002 | Lyster et al. |
| 2003/0120310 A1 | 6/2003 | Mulhauser |
| 2003/0012340 A1 | 7/2003 | McIlnay et al. |
| 2003/0171779 A1 | 9/2003 | Kelly et al. |
| 2003/0171780 A1 | 9/2003 | Kelly |
| 2004/0002738 A1 | 1/2004 | Waltman |

\* cited by examiner

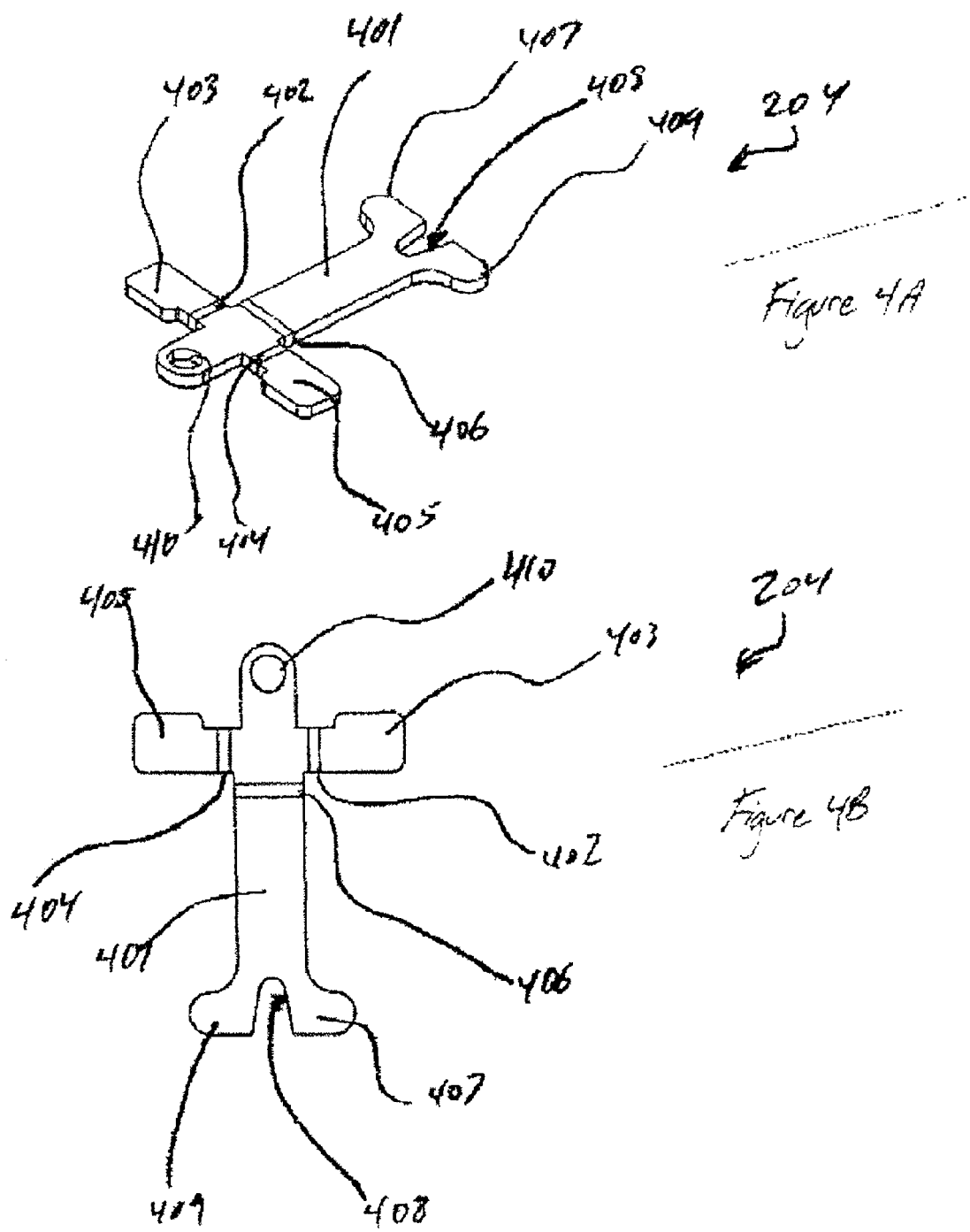

US 6,885,562 B2

CIRCUIT PACKAGE AND METHOD FOR MAKING THE SAME

FIELD OF THE INVENTION

The present invention relates to circuit packages, and more particularly to a circuit package for high-power semiconductor circuits.

BACKGROUND OF THE INVENTION

High-power circuits dissipate a significant fraction of its power in the form of heat. The temperature of a circuit depends upon the heat generating characteristics of the circuit components, the heat transfer properties of the circuit package, and the temperature of the surrounding environment. As the temperature of a circuit component approaches the operating temperature limit, the performance of the circuit component substantially degrades. More specifically, operating a circuit at high temperatures reduces its operating life-span, causes it to operate at slower speeds, and causes it to produce other non-ideal operating characteristics. As can be appreciated by one of ordinary skill in the art, the operating temperature of a circuit can be reduced by enhancing the heat dissipation properties of a circuit package housing the circuit.

As known by one of ordinary skill in the art, heat dissipation from circuit packages can be enhanced by the use of externally mounted metallic heat sinks. One example of a circuit package utilizing an attached heat sink is shown in U.S. Pat. No. 5,517,058, to Temple. Heat sinks such as those disclosed in Temple are typically made of aluminum or aluminum alloy and are attached to the top surface of a molded plastic circuit package by mechanical means and/or with a thermally conductive adhesive.

Although externally mounted heat sinks may enhance the heat dissipation of a circuit package, external heat sinks are not suitable for many applications. For instance, in circuit designs where circuit packages are closely aligned or enclosed in a small housing, external heat sinks complicate design efforts and often result in added cost and wasted space. External heat sinks also present many other design complications because they substantially increase the dimensions and weight of a circuit package.

As also known in the art, heat dissipation from a circuit package may also be increased by the use of a material having suitable heat transfer properties. For instance, as shown in European Patent EP 0767495B1 to Sono et al., the bulk of a circuit package consists of a resin. In such designs, the heat dissipated by the circuit component encapsulated in the resin may be enhanced by providing additional thermal pathways from the individual circuit components to the external environment. Although these generally known designs may enhance heat dissipation of a circuit package, such designs also rely on a heat sink to draw the generated heat away from the circuit components and circuit package itself. Such prior art circuit packages present design complications similar to those described above.

As summarized above, is can be appreciated by one of ordinary skill in the art that there is a need for a circuit package with improved heat dissipation properties, and a design that consumes less space.

SUMMARY OF THE INVENTION

The present invention provides a circuit package for high-power semiconductor circuits such as an H-bridge. The circuit package improves the thermal management of heat generated by a circuit enclosed in the circuit package. A plurality of shaped leads allow the circuit package to stand in an upright position when mounted on an external circuit board, thereby reducing the amount of space consumed by the circuit package. In addition, one embodiment of the present invention reduces flux creepage between the leads of the circuit package by the use of a shaped cavity formed in the bottom surface of the circuit package.

In one embodiment, the circuit package comprises two circuit boards positioned in different planes, at least one brace affixed between the two circuit boards, a molded housing enclosing an area between the circuit boards, and a plurality of electrically conductive flanges extending from at least one edge of each circuit board. The plurality of conductive flanges are positioned to extend from the sides of the circuit package. The brace also provides electrical communication between the circuit components mounted on each circuit board.

In one specific embodiment, the circuit package comprises two circuit boards that are positioned in a side-by-side orientation to form an A-frame structure, where two brace members affix the two circuit boards together near the top of the A-frame. In this embodiment, the two circuit boards each have a conductive layer disposed on one side of each circuit board. The two circuit boards are oriented such that the surfaces having the conductive layer are facing one another. A plurality of circuit components, such as a plurality of switches and/or semiconductors, are soldered to the conductive layers of each circuit board. A plurality of conductive flanges, also referred to as leads, are affixed to the conductive layers of the two circuit boards near the base of the A-frame. The conductive flanges are positioned to extend from at least one edge of each circuit board. The conductive flanges are configured to hold the circuit package on an external surface, such as an external circuit board, in an upright position. The conductive flanges are also electrically connected to the conductive layer of each circuit board, which allows the circuit components to communicate with an external circuit board on which the circuit package is mounted. In addition, this embodiment comprises a molded material formed to fill the volume between the two circuit boards of the A-famine structure.

In another specific embodiment, the circuit package comprises two circuit boards each having a conductive layer disposed on one side of each circuit board. In this embodiment, the circuit boards are oriented such that the sides having the conductive layer are opposed to one another. In this embodiment, the two circuit boards are affixed to one another by a brace, which also functions as a conductor between a plurality of circuit components mounted on the conductive layers of each circuit board. A plurality of leads are affixed to the conductive layers, and are oriented to extend from at least one edge of each circuit board. The plurality of leads are configured to hold the circuit package in an upright position when mounted on an external circuit board. The plurality of leads are electrically connected to the conductive layer of each board to allow the circuit components of each circuit board to communicate with the external circuit board on which the circuit package is mounted. In addition, this embodiment comprises a molded material formed to encapsulate the two circuit boards and the plurality of circuit components mounted thereon.

In yet another embodiment, an H-bridge circuit is configured on the circuit boards of the circuit package. The H-bridge circuit can be formed into a number of configurations having a plurality of switches. For instance, a switch can be any switching device such as a bipolar junction transistors (BJT), silicon controlled rectifier (SCR), or insulated gate bipolar transistors (IGBT). In one specific configuration, the H-bridge circuit comprises four SCR's, where two SCR's are each mounted on the first and second circuit boards. In another specific embodiment, the H-bridge circuit comprises three SCR's and one IGBT, where two SCR's are mounted on the first circuit board and an IGBT and SCR are mounted on the second circuit board. Other alternative embodiments utilize other combinations of IGBTs and SCR's configured on each circuit board of the circuit package.

BRIEF DESCRIPTION OF THE DRAWINGS.

The foregoing aspects and many of the attendant advantages of this invention will become more readily appreciated as the same become better understood by reference to the following detailed description, when taken in conjunction with the accompanying drawings, wherein:

FIG. 3A is a bottom perspective view of the circuit board assembly of FIG. 2 having formed contact leads attached thereto;

FIG. 3B is a top perspective view of the circuit board assembly depicted in FIG. 3A;

FIG. 4A is a top front perspective view of a brace used in the construction of the circuit board assembly depicted in FIG. 2;

FIG. 4B is a top view of the brace depicted in FIG. 4A;

DETAILED DESCRIPTION OF THE PREFERRED EMBODIMENT

The present invention provides a circuit package for high-power semiconductor devices such as an H-bridge. The circuit package improves the thermal management of heat generated by the circuit enclosed in the circuit package. By the use of a plurality of shaped leads that hold the circuit package in an upright position, the circuit package also provides a structure that consumes less space when mounted on an external circuit board.

Figure 1:
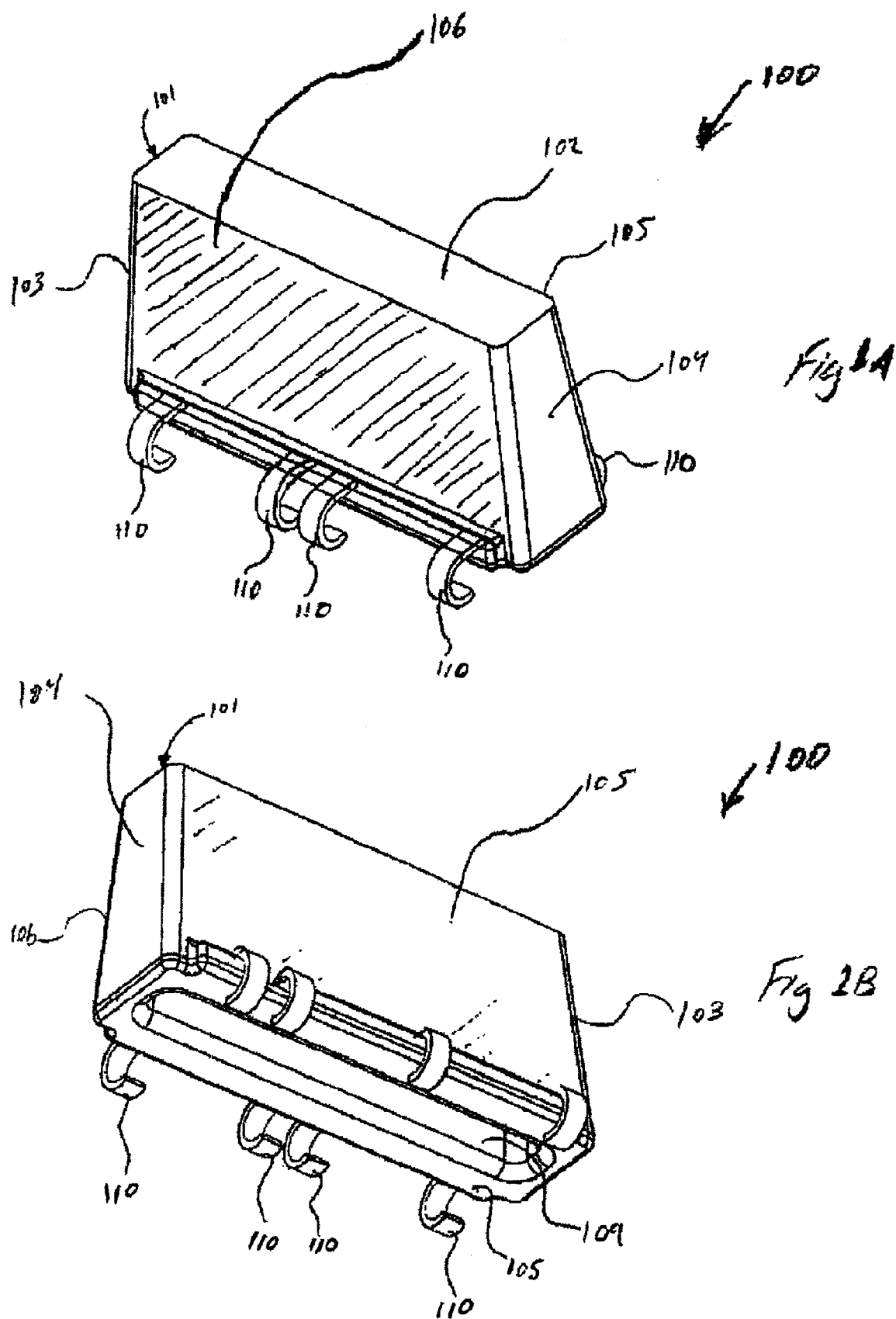
FIG. 1A is a top front perspective view of a circuit package in accordance with the present invention.
FIG. 1B is a bottom back perspective view of the circuit package shown in FIG. 1A.

With reference to FIGS. 1A and 1B, one embodiment of a circuit package 100 includes a molded housing 101 having a top surface 102, bottom surface 108, and four walls 103-106 extending at an angle between the top surface 102 and the bottom surface 108. The two sidewalls 105 and 106 of the circuit package 100 are formed from exposed surface areas of two circuit boards configured in the circuit package. In one embodiment, the circuit board is made from a single-sided direct copper bonding (DCB) circuit board, where the non-copper side of the circuit board is exposed to the exterior surface of the circuit package. The two end walls 103 and 104, the top surface 102, and the bottom surface 108 are formed from an injected molded plastic. In one embodiment, the injected molded plastic is configured to form an exterior surface that is flush with the exposed surface of the two circuit boards.

The circuit package 100 further comprises a number of electrically conductive flanges 110 extending from each sidewall 105 and 106. In one embodiment, the electrically conductive flanges 110 are positioned along the bottom edge of each sidewall 105 and 106. In this embodiment, the electrically conductive flanges 110 are bent in a curved shape forming a "J" configuration. Also shown in FIG. 1B, one embodiment comprises a cavity 109 formed into the bottom surface 108 of the circuit package 100. As depicted in FIG. 1B, the cavity 109 is formed into an elongated grove that extends between the first and second ends 104 and 103 of the circuit package 100. The housing 101 is preferably made from a durable, resistive material, such as injected molded plastic, resin, or the like. The electrically conductive flanges 110 can be made from a conductive material such as copper.

Figure 2:
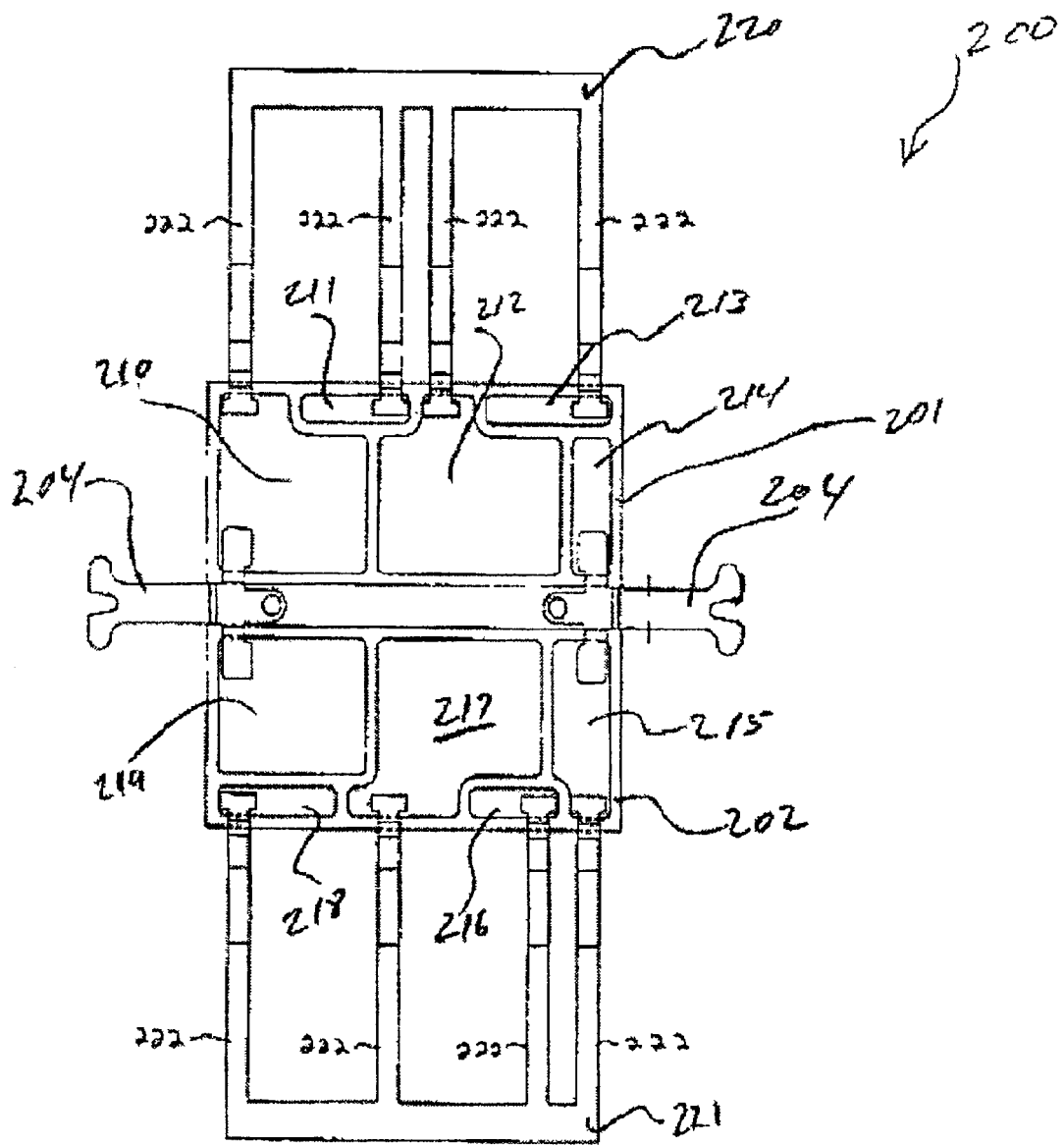
FIG. 2 is a top view of a circuit board assembly in accordance with one embodiment of the present invention, the circuit board assembly comprising two circuit boards joined by two braces.
Figure 2A:
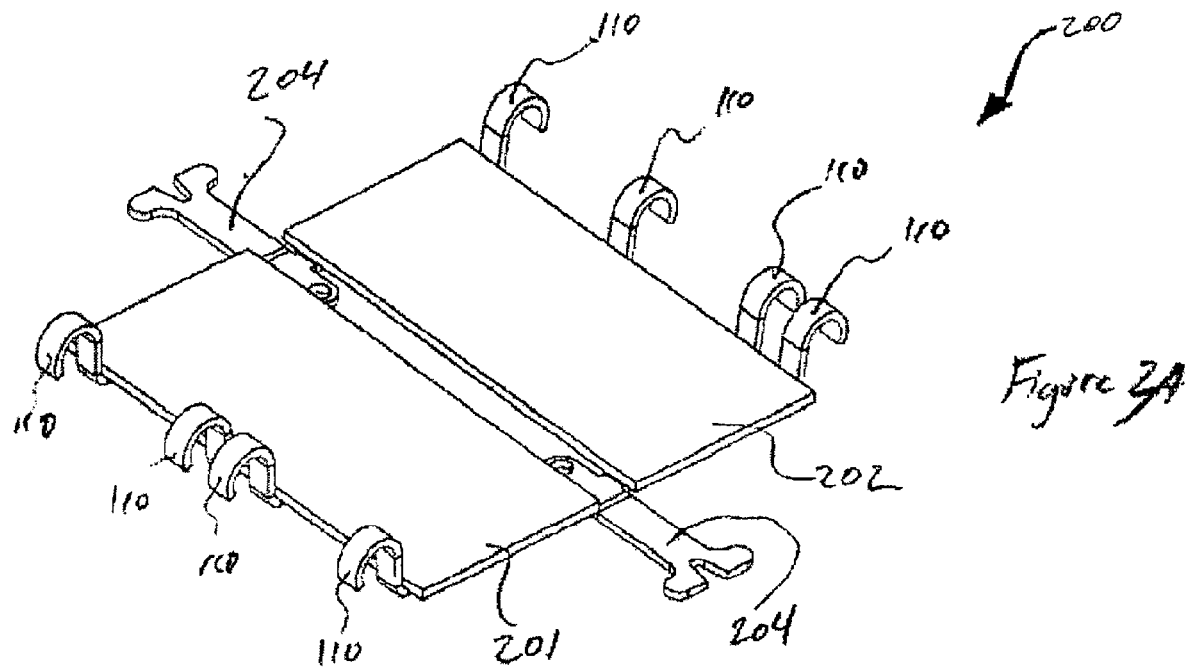
Figure 2B:
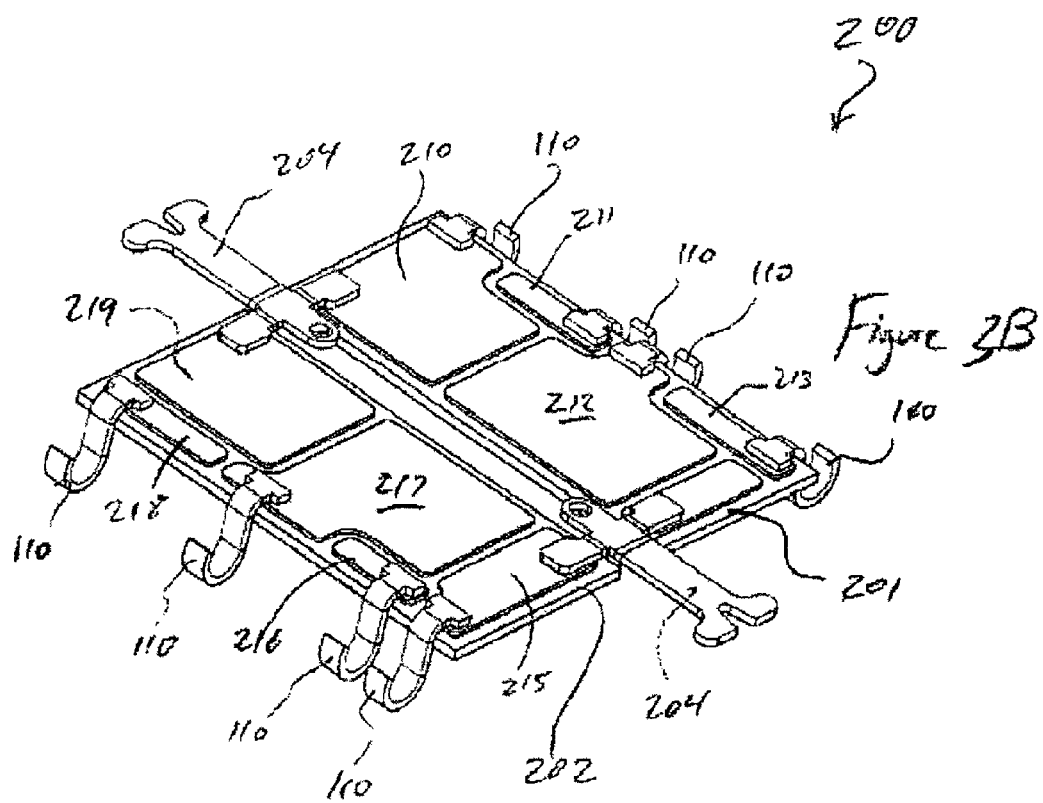

FIG. 2 illustrates one embodiment of a circuit board assembly 200 utilized in the construction of the circuit package 100. The circuit board assembly 200 comprises a first circuit board 201, a second circuit board 202, and at least two braces 204 that affix the first circuit board 201 to the second circuit board 202. As shown in FIG. 2, each circuit board 201 and 202 has a plurality of shaped conductive contacts 210–219 etched onto the top surface of the first and second circuit boards 201 and 202. As described in more detail below, the shaped conductive contacts 210–219 of this illustrative embodiment are configured to accommodate components of a circuit such as an H-bridge. Although this illustrative example involves the implementation of a circuit in the form of an H-bridge, the circuit package 100 and circuit board assembly 200 of the present invention can also be configured to accommodate other circuits.

Also shown in FIG. 2, the circuit board assembly 200 also comprises a first flange assembly 220 and a second flange assembly 221. In this illustrative embodiment, the first and a second flange assemblies 220 and 221 comprise a plurality of elongated members 222. In one embodiment, the plurality of elongated members are aligned such that each elongated member 222 is parallel to one another. In this embodiment, a temporary brace is formed to affix the elongated members 222 of an individual flange assembly to one another. Also shown in FIG. 2, each elongated member 222 is connected to at least one contact of the circuit boards 201 and 202. As will be described in more detail below with reference to FIG. 8, the first and second flange assemblies 220 and 221 are used to hold the circuit package 100 in place during the application of an injection molded plastic.

The shaped conductive contacts 210–219 can be made of a conductive material such as copper. In one example, the first and second circuit boards 201 and 202 can be made from a direct copper bonding (DCB) circuit board. As can also be appreciated by one of ordinary skill in the art, the conductive contacts 210–219 can be etched into any shape or form to accommodate a number of circuit configurations. The conductive contacts 210–219 can be formed by any commonly known etching process. For instance, in one embodiment, a patterned mask can be positioned over a continuous copper layer disposed on a circuit board. An effective etchant, such as sulfuric acid ($H_2SO_4$) may be used to create the shaped conductive contacts 210–219. As also can be appreciated by one of ordinary skill in the art, the first and second circuit boards 201 and 202 can be made from any known circuit board or substrate material, such as beryllium oxide (BeO).

Referring now to FIGS. 3A and 3B, two perspective views of the circuit board assembly 200 having shaped leads 110, are shown and described. As shown in FIG. 3A, the bottom surface of each circuit board 201 and 202 forms a substantially flat surface. As shown in FIG. 3B, the top surface of each circuit board 201 and 202 comprise the plurality of conductive contacts 210–219, and a plurality of leads 110 and braces 204 attached thereto. In this illustrative embodiment, the circuit board assembly 200 is formed from the circuit board assembly 200 shown in FIG. 2. The circuit board assembly 200 comprises portions of the first and second flange assemblies 220 and 221, where the elongated members 222 of the flange assemblies 220 and 221 are cut to a desired length, thereby forming the leads 110 of the circuit board assembly 200.

As shown in FIGS. 3A and 3B, the elongated portions of the flange assemblies 220 and 221 are cut so that each elongated member individually connects to a shaped conductive contact on the first and second circuit boards 201 and 202. Accordingly, once the elongated members of the flange assemblies 220 and 221 have been cut, the elongated members form a plurality of independent leads. Once cut to a desired length, each elongated member is shaped into a "J" configuration, where the end of each elongated member forms a curve that is directed toward the top surface of each circuit board. The portion of each lead adjacent to the circuit board may also be bent toward the bottom surface of each circuit board 201 and 202.

FIGS. 4A and 4B show one embodiment of a brace 204 utilized in the construction of the circuit board assembly 200. Generally described, the brace 204 comprises a body 401 that is shaped into an elongated member. As shown in FIG. 4A, one embodiment of the brace 204 includes an aperture 410 formed through the top end of body 401. Opposite the aperture 410, a notch 408 may be cut into the end of the body 401. The notch 408 separates two leg portions 407 and 409 that extend in opposite directions from the sides of the body 401. The notch 408 is sized such that the length of the notch may be approximate to the width of each leg portion 407 and 409. Also shown in FIGS. 4A and 4B, the brace 204 also comprises two arm portions 403 and 405 that extend in opposite directions from the sides of the body 401. In this embodiment of the brace 204, the arm portions 403 and 405 extend in the same plane as the two leg portions 407 and 409. The brace 204 may also comprise areas of etched metal that form joints 402 and 404 that separate each arm portion 403 and 405 from the body 401. As can appreciated by one of ordinary skill in the art, the brace 204 may-be formed from any conductive material such as copper, aluminum, steel or other conductive materials. In one embodiment, the brace 204 is formed by a stamping process that creates the brace 204 from a flat sheet of metal.

Figure 4C:
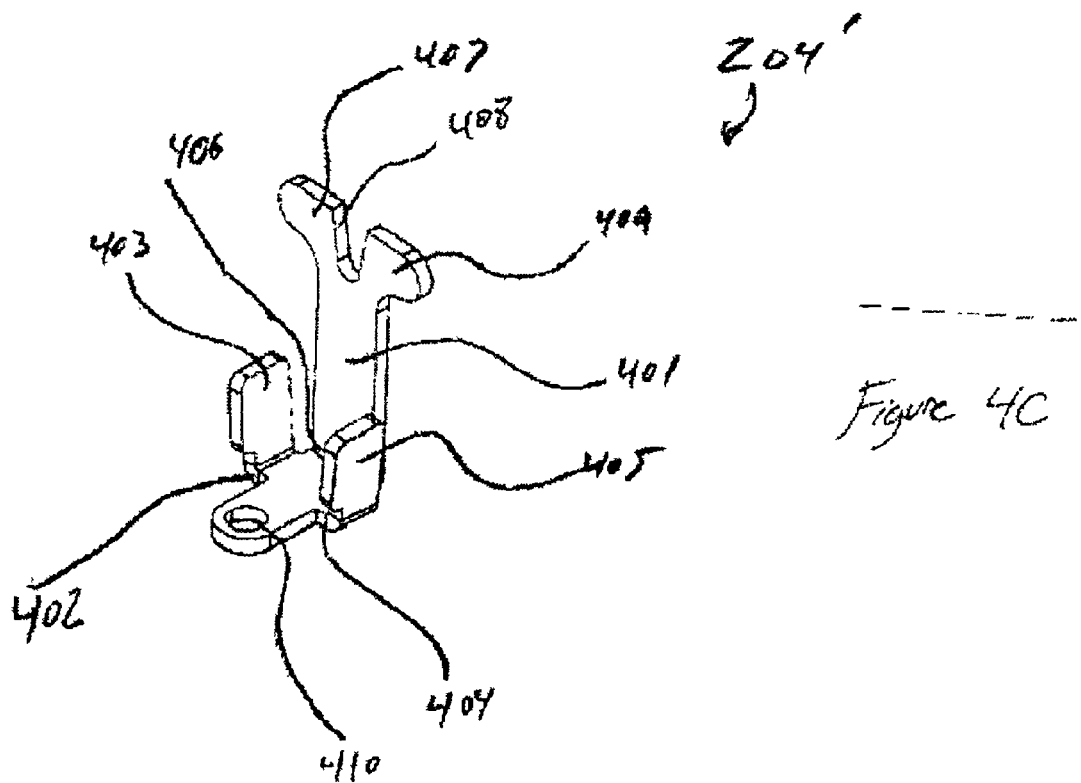
FIG. 4C is a top front perspective view of a formed brace used in the construction of the circuit board assembly.
Figure 4D:
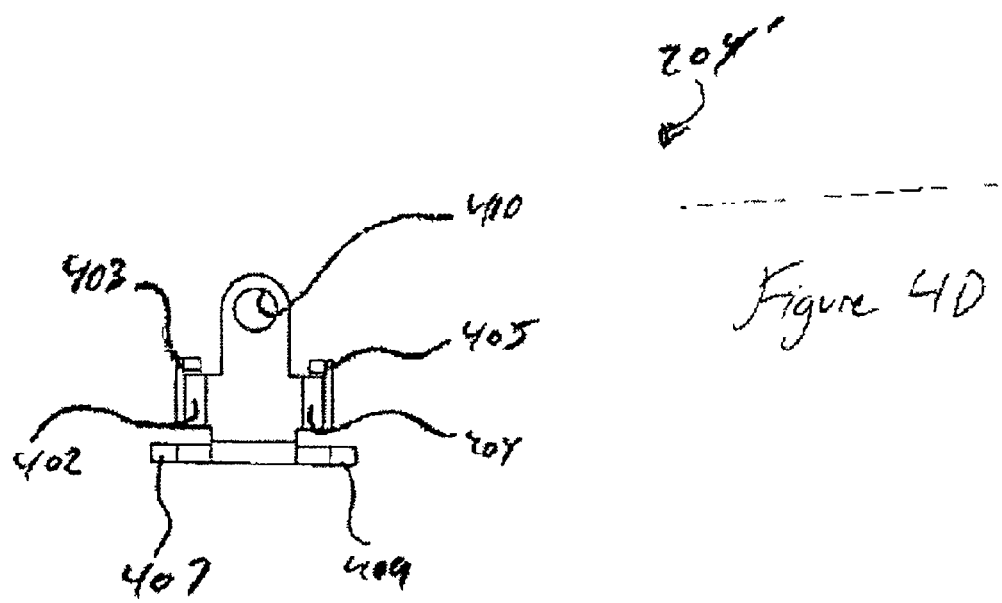
FIG. 4D is a bottom view of the formed brace depicted in FIG. 4C.

FIGS. 4C and 4D show perspective and top views of a formed brace 204'. As shown in FIGS. 4C and 4D, the formed brace 204' is made from the brace 204 shown in FIGS. 4A and 4B. More specifically, the formed brace 204' is made by applying a series of cold metal bends to the brace 204 shown in FIGS. 4A and 4B. In one embodiment, the formed brace 204' is made by bending the arm portions 403 and 405 toward the top surface of the brace 204'. In this embodiment, the cold metal bends are formed such that the joints 402 and 404 form a bend having a radius of 0.5 mils. In addition, the formed brace 204' comprises a cold metal bend near the midsection of the body 401. In this embodiment, the bottom portion of the body 401 is bent towards the top surface of the formed brace 204'. The cold metal bend formed in the midsection of the body 401 may have a radius of approximately 0.5 mils.

Figure 5A:
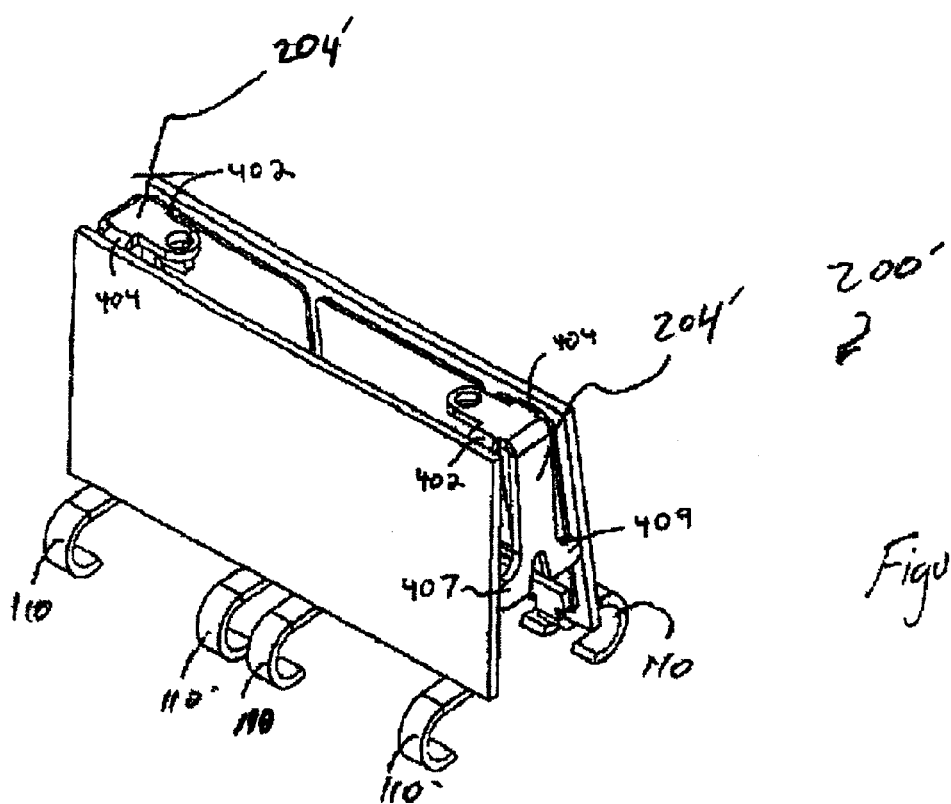
FIG. 5A is a top front perspective view of a formed circuit board assembly having formed contact leads and two formed braces.
Figure 5B:
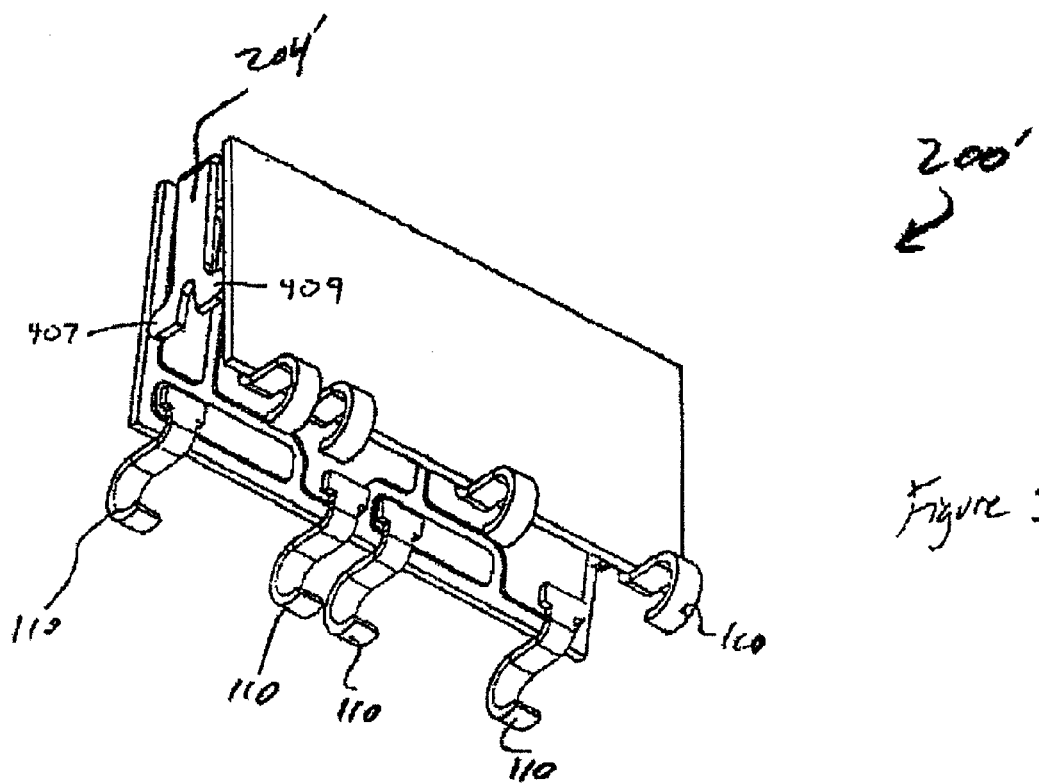
FIG. 5B is a bottom back perspective view of the formed circuit assembly depicted in FIG. 5A.

Referring now to FIGS. 5A and 5B, two perspective views of a formed circuit board assembly 200' having formed braces 204' are shown and described. In one method for forming the circuit board assembly 200' having formed braces 204', the braces 204 (FIG. 2) are soldered to at least one conductive contact on each circuit board 201 and 202. Once the braces 204 are connected to the circuit boards, cold metal bends are created in the braces 204 by rotating the first and second circuit boards 201 and 202 around the brace 204 such that the conductive contacts of each circuit board face one another. As shown in FIGS. 5A and 5B, the formed braces 204' are bent at the joints 402 and 404 of each arm extending from the body of the brace 204'. In addition, the center of the formed brace 204' is bent at an angle, thereby allowing the two leg portions 407 and 409 to extend between the first and second circuit boards. The leg portions 407 and 409 are configured to function as a flexible spacer between the two circuit boards, which reduces the amount of stress applied to the circuit boards when the circuit boards are compressed toward one another. The flexible characteristic of the leg portions 407 and 409 assist the injection molding process, as described below with reference to FIG. 8.

Figure 6:
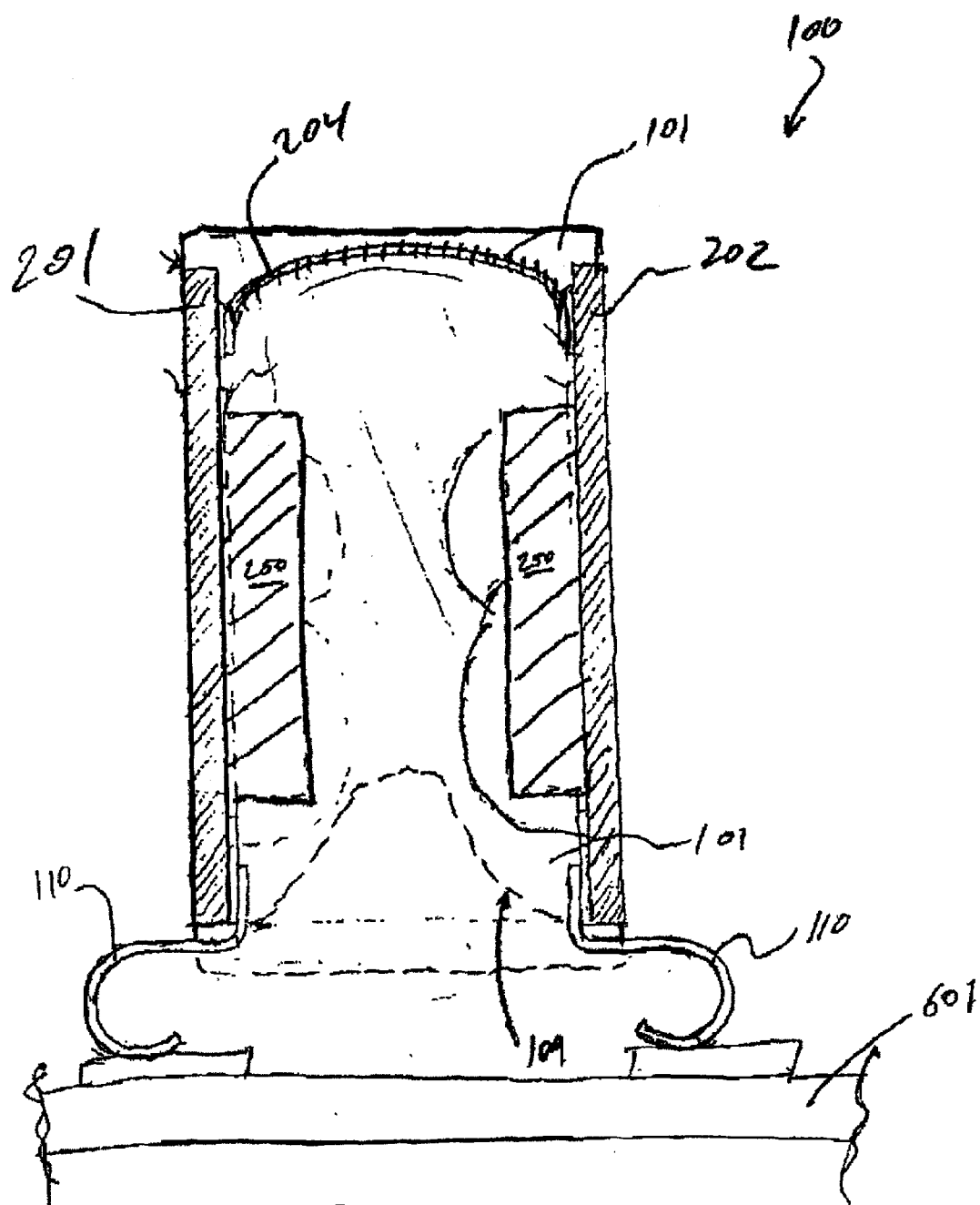
FIG. 6 is an end section view of one embodiment of the circuit package having two circuit boards in an A-frame configuration.

Referring now to FIG. 6, an end section view of one embodiment of the circuit package 100 is shown and described below. This end section view illustrates the relative position of the top portion of the brace 204, the first and second boards 201 and 202, the circuit components 250, the leads 110, and the molded housing 101. As shown in FIG. 6, the molded housing 101 is formed to fill the volume between the first and second circuit boards 201 and 202. In addition, the molded housing 101 is also shaped to form a cavity 109 that extends into the bottom surface 108 of the circuit package 100. In this embodiment, the exterior surface of the molded housing 101 is formed to create a flush surface with the exterior surfaces of the first and second circuit boards 201 and 202. Accordingly, at least one surface of each circuit board 201 and 202 is exposed to the external environment surrounding the circuit package 100.

As shown in FIG. 6, the circuit components 250, housed in the circuit package 100 are enclosed in the molded housing 101. Also shown in FIG. 6, the electrically conducted flanges 110 are configured to extend from the sides of the circuit package 100. The electrically conducted flanges 110 are also curved in an inward direction to create a structure that holds the circuit package 100 in an upright position when mounted on an external surface 601.

Figure 7:
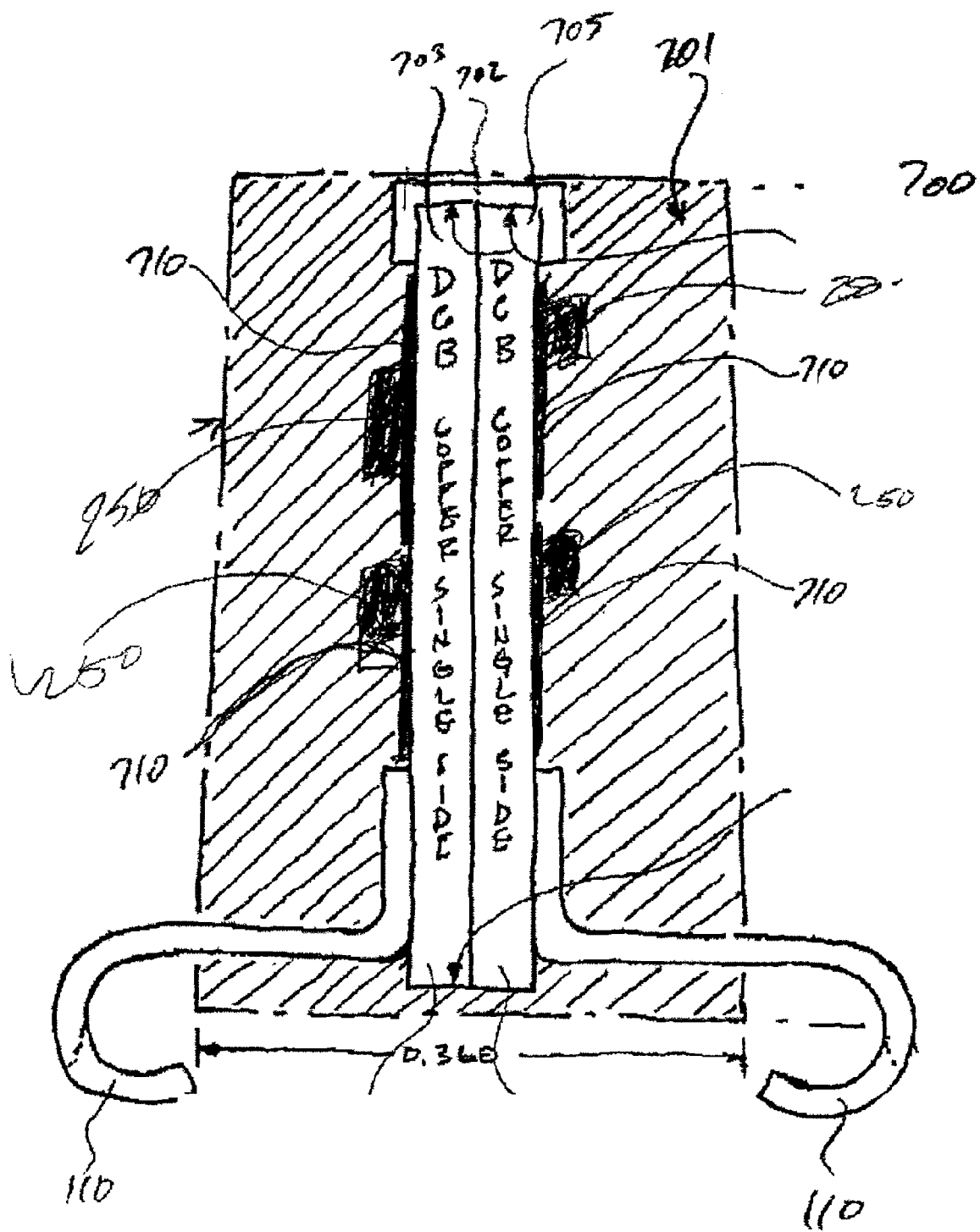
FIG. 7 is an end section view of another embodiment of a circuit package having two joined circuit boards.

Referring now to FIG. 7, another embodiment of a circuit package 700 is shown. In this embodiment, the circuit package 700 comprises a first circuit board 703, a second circuit board 705, a plurality of circuit contacts 710, a brace 702, and a plurality of electrically conducted flanges 110. As shown in the end section view of FIG. 7, this embodiment further comprises a housing 701 made from a molded plastic that forms a protective barrier around the circuit components 250, the circuit boards 703 and 705, the conductive layers 710 etched on the circuit boards, and the brace 702. In this embodiment, each circuit board 703 and 705 may be made from any of the circuit board materials listed above, such as a single-sided direct copper bonded circuit board.

As shown in FIG. 7, the first and second circuit boards 703 and 705 are positioned together by joining the non-copper surfaces of each circuit board 703 and 705. In this embodiment, the brace 702 is formed into a U-shaped clamp that is configured to receive the first and second circuit boards 703 and 705. The brace 702 holds the circuit boards together and functions as a conductor between the circuit contacts 710 of each circuit board. Similar to the circuit package 100 depicted in FIG. 1A, this embodiment comprises a housing 701 that is formed by an injection molding process.

Figure 8:
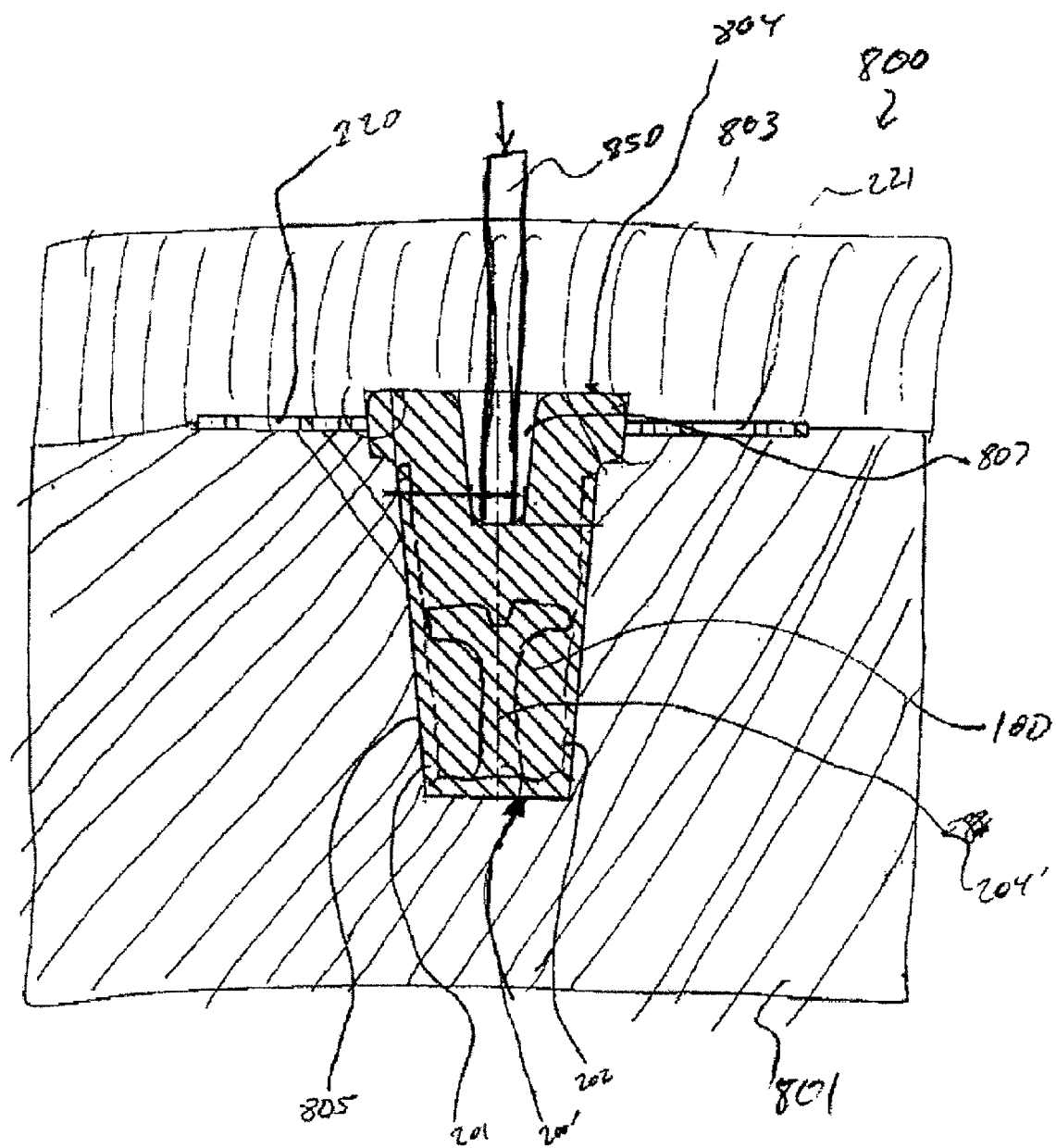
FIG. 8 is an end section view of one embodiment of the circuit package and a mold utilized in the construction of the circuit package.

Referring now to FIG. 8, one embodiment of a mold 800 utilized in the construction of a circuit package 100 is shown and described below. Generally described, the circuit package 100 is formed by first positioning a formed circuit board assembly, such as the embodiment illustrated in FIG. 5A, in a mold suited for plastic injection molding. Once positioned, a plastic or resin filling material is applied to the mold, thereby filling the area internal to the circuit board assembly. The mold is configured to form a plastic housing around the ends of the circuit board assembly. In one embodiment, the mold allows the plastic or resin to fill the area internal to the circuit board assembly without covering the exterior surfaces of the circuit boards. The exterior surface formed by the plastic or resin may be configured to form a flush surface with the exterior surface of each circuit board.

In one embodiment, a manufacturing process for forming a circuit package employs the use of a first mold 801 and a second mold 803. As shown in the end section view of FIG. 8, the first mold 801 comprises a cavity 805 that is shaped and sized to receive a circuit board assembly 200'. More specifically, the side walls of the cavity 805 are configured to form a flat surface such that, when the formed circuit board assembly 200' is inserted into the cavity 805, the external surface area of the first and second circuit boards 201 and 202 uniformly contact the side walls of the cavity 805.

The second mold 803 comprises a cavity 804 shaped and sized to form the bottom surface of the circuit package. As shown in FIG. 8, the second mold 803 may also comprise a ridge 807 formed at the bottom of the cavity 804. In one embodiment, the ridge 807 has a parabolic cross section positioned in the center of the cavity 804. When the second mold 803, is placed over the formed circuit board assembly 200' and the first mold 801, the center of the cavity 804 of the second mold 803 is vertically positioned over the center of the cavity 805 of the first mold 801 When placed together, the first and second molds 801 and 803 are configured to receive the first and second flange assemblies 220 and 221 of the formed circuit board assembly 200' in a void configured between the molds 801 and 803.

Once the first and second molds 801 and 803 are positioned around the formed circuit board assembly 200', a filling material, such as a resin or plastic, is injected into the area between the first and second circuit boards of the circuit board assembly 200'. In one embodiment, the filling material is fed through a conduit 850 that is channeled through the second mold 803. More specifically, the conduit 850 feeds the filling material from the exterior surface of the second mold 803, through the post 807, and into the interior sections of the molds 801 and 803. This configuration provides a suitable path for the injection of the filling material without causing undue pressure on the circuit boards 201 and 202 during the injection process. As described above, the formed braces 204' hold the first and second circuit boards 201 and 202 in position during the injection process. In addition, the formed braces 204' provide a sufficient amount of flexibility to reduce the stress applied to the first and second circuit boards 201 and 202 during the injection process.

In one aspect of the present invention, the circuit package of the present invention is configured to accommodate high-power circuits. For instance, in one illustrative example, the circuit package of the present invention is configured with an H-bridge circuit. For illustrative purposes FIGS. 9A–10B show two configurations of an H-bridge circuit: a first configuration having four SCR switches and a second configuration having three SCR switches and one IGBT switch.

Figure 9A:
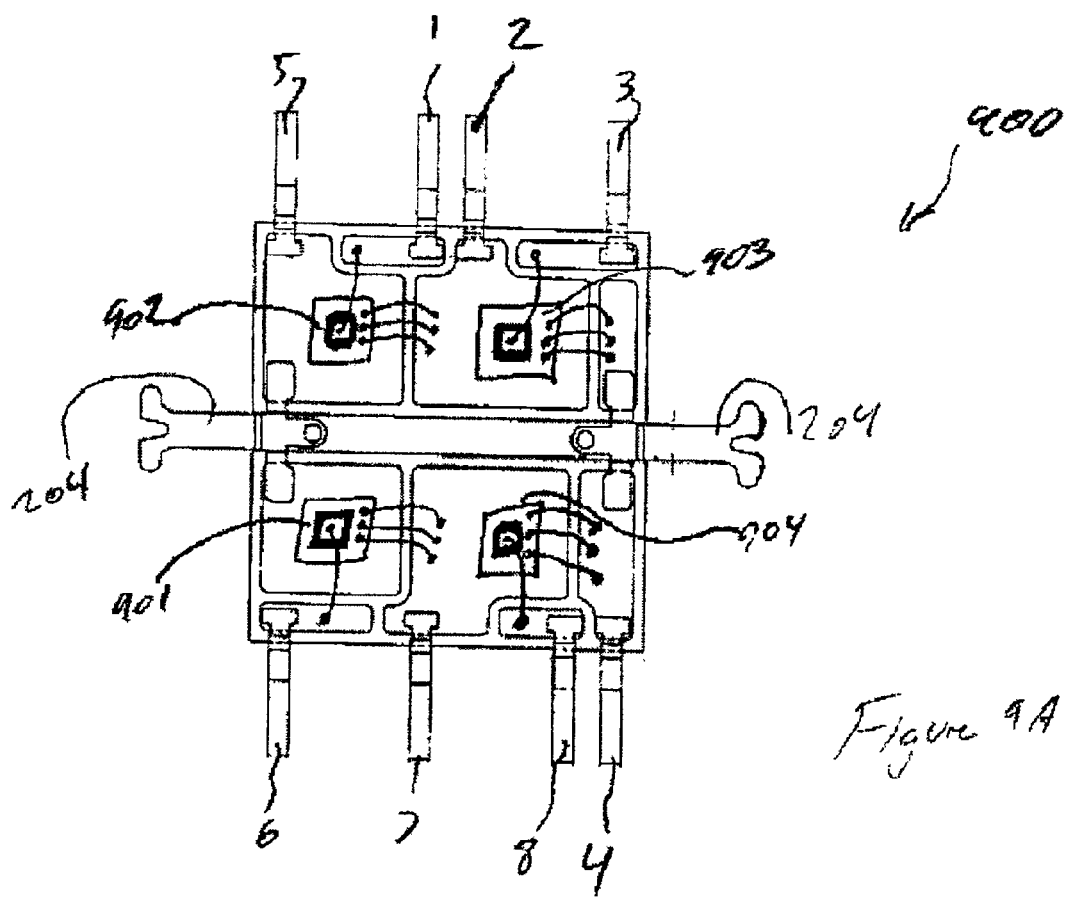
FIG. 9A is a top view of one embodiment of a circuit board assembly configured with an H-bridge circuit.
Figure 9B:
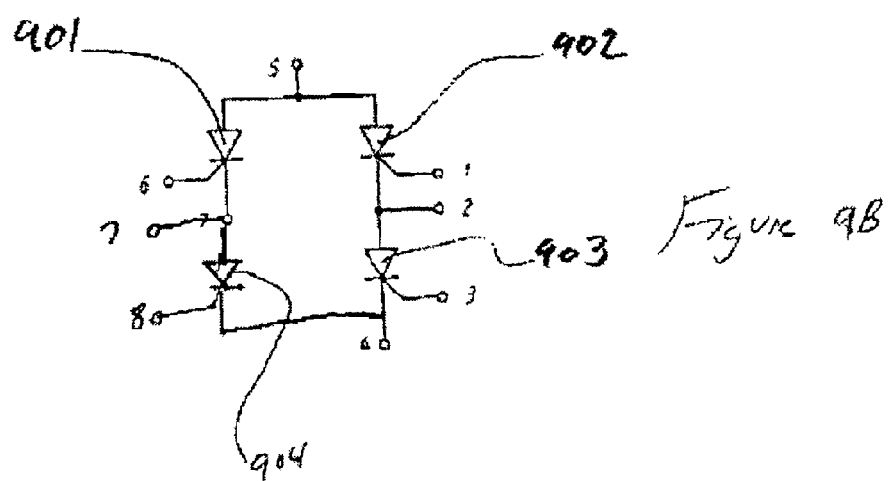
FIG. 9B is a schematic diagram of the circuit depicted in FIG. 9A.

Referring now to FIG. 9A, an illustrative example of an H-bridge circuit having four switches 901–904 is shown and described below. In accordance with one embodiment of the present invention, the device components referred to as switches 901–904 can be in the form of a silicon controlled rectifier (SCR) switch. FIG. 9B depicts a circuit schematic diagram modeling the H-bridge circuit shown in FIG. 9A. As shown in FIG. 9A, each lead of the circuit board assembly is labeled with a unique reference number and associated with a node of the schematic diagram shown in FIG. 9B.

In this embodiment, a first switch 901 is soldered directly onto the contact that forms node 5. As can be appreciated by one of ordinary skill in the art, the bottom surface of each switch forms the collector of the device. Accordingly, the collector of the first switch 901 is electrically connected to the contact that forms node 5. In this illustrative example, the base of the first switch 901 is electrically connected to node 6 by the use of a jumper. The emitter of the first switch 901 is electrically connected to the contact that forms node 7.

Also shown in FIGS. 9A and 9B, the collector of the second switch 902 is soldered to the contact that forms node 5, and node 5 is electrically connected to the collector of the second switch 912 via the brace. Also shown, the base of the second switch 902 is connected to the contact that forms node 1, and the emitter of the second switch 902 is electrically connected to the contact that forms node 2. The collector of the third switch 903 is also electrically connected to the contact that forms node 2. In addition, the base of the third switch 903 is electrically connected to the contact that forms node 3, and the emitter of the third switch 903 is electrically connected to the contact that forms node 4. The collector of the fourth switch 904 is correspondingly soldered to the contact that forms node 7. Accordingly, the drain of the fourth switch 904 is electrically connected to the contact that forms node 7, and the base and emitter of the fourth switch 904 are respectively connected to nodes 8 and 4. In one mode of operation, a positive voltage is applied to node 5 and a ground or negative voltage is applied to node 4. Nodes 7 and 2 represent the output of the H-bridge circuit.

Figure 10A:
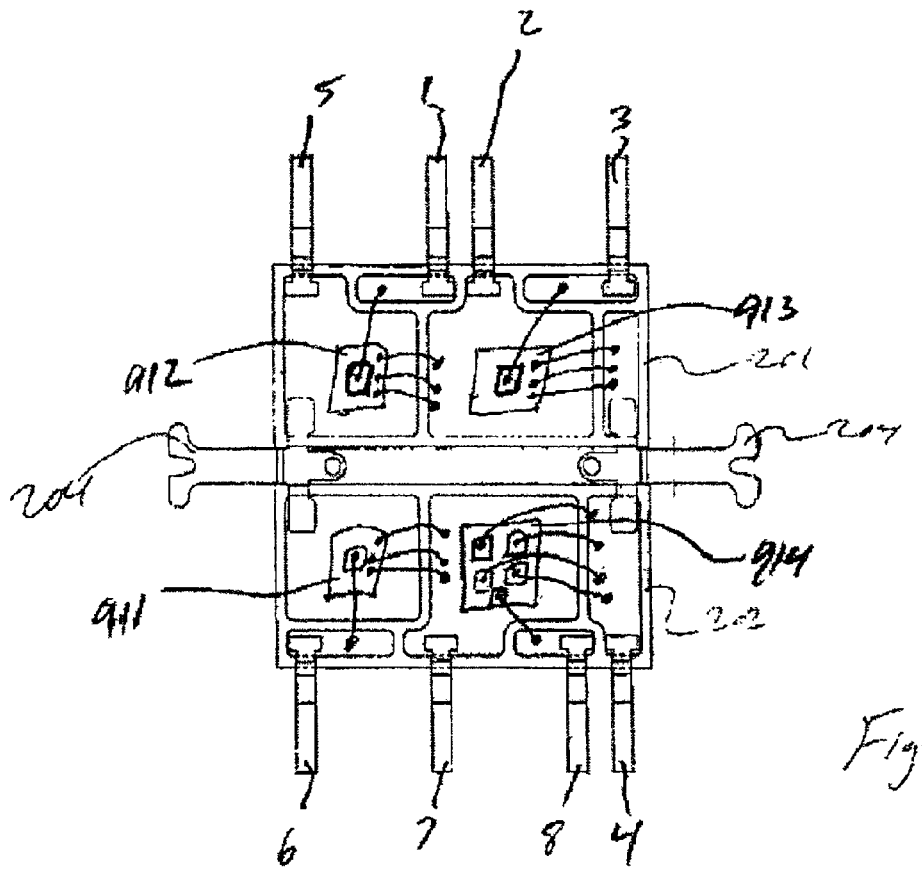
FIG. 10A is a top view of another embodiment of a circuit board assembly configured with an H-bridge circuit having three silicon controlled rectifiers and one insulated gate bipolar transistor configured on the circuit board assembly.
Figure 10B:
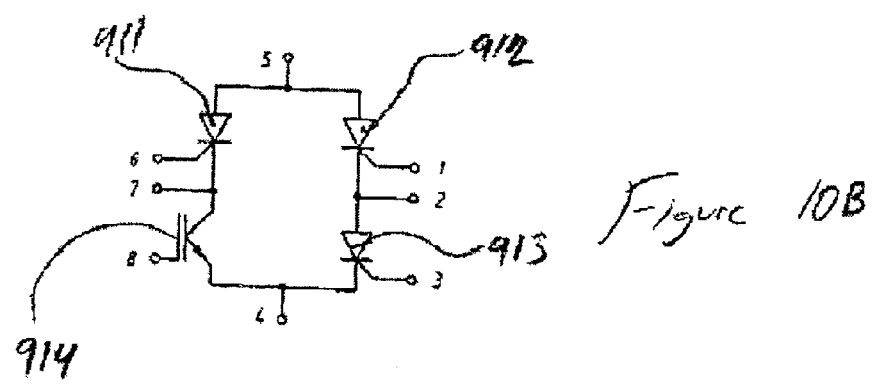
FIG. 10B is a schematic diagram of the H-bridge circuit depicted in FIG. 10A.

Referring now to FIGS. 10A–10B, another embodiment of an H-bridge circuit having three SCR switches 911–913 and one IGBT switch 914 is shown and described below. As shown in FIGS. 10A–10B, the collector of the first switch 911 is soldered directly onto the contact that forms node 5. With reference to the first circuit board 201, the base of the first switch 911 is electrically connected by a jumper lead that forms an electrical contact with node 6. The emitter of the first switch 911 is electrically connected to the contact that forms node 7.

Similarly, the collector of the second switch 912 is soldered to the contact that forms node 5. Also shown, the base of the second switch 912 is electrically connected to the contact that forms node 1, and the emitter of the second switch 912 is electrically connected to the contact that forms node 2. With reference to the third switch 913, the collector is electrically connected to the contact that forms node 2. In addition, the base of the third switch 913 is electrically connected to the contact that forms node 3 and the emitter of the third switch 913 is electrically connected to the contact that forms node 4. The drain of the IGBT 914 is soldered to the contact that forms node 7, and the gate and source of the IGBT 914 are respectively connected to nodes 8 and 4. In one mode of operation, a positive voltage is applied to node 5 and a ground or negative voltage is applied to node 4. Nodes 7 and 2 represent the output of the H-bridge circuit.

Although the above illustrative example H-bridge circuits has been used to illustrate various aspects of the present invention, the circuit package and circuit board assembly of the present invention can be utilized with many other circuit configurations. In addition, the circuit package and circuit board assembly of the present invention can be modified to accommodate different embodiments of an H-bridge circuit as shown in commonly assigned U.S. Pat. No. 6,175,765, the subject matter of which is hereby expressly incorporated by reference.

While the preferred embodiment of the invention has been illustrated and described, it will be appreciated that various changes can be made therein without departing from the scope of the invention. Similarly, any process steps described herein might be interchangeable with other steps in order to achieve the same result. In addition, the illustrative examples described above are not intended to be exhaustive or to limit the invention to the precise forms disclosed.

What is claimed is:

1. A circuit package for an electronic device, comprising:
    a first circuit board positioned in a first plane;
    a second circuit board positioned in a second plane;
    at least one brace coupled to the first circuit board and the second circuit board;
    at least two electrically conductive leads extending from at least one surface of the circuit package; and
    a housing formed between the first and second circuit boards that covers at least one surface of each circuit board and leaves another surface of each circuit board substantially uncovered to thereby expose the uncovered surface to an environment exterior of the circuit packages,
    wherein the housing includes an external surface that is flush with the uncovered surfaces of each circuit board.

2. The circuit pads of claim 1, wherein the housing comprises a bottom surface that includes a cavity formed therein.

3. The circuit package of claim 1, wherein the first and second circuit boards are each made of a single sided direct bonded copper substrate.

4. The circuit package of claim 1, wherein the brace comprises:
    an elongate body;
    at least two arm portions extending from the body at least one of the arm portions coupled to the first circuit board and another of the arm portions coupled to the second circuit board; and
    at least two leg portions extending from the body each leg portion operable to function as a flexible spacer between the first and second circuit boards.

5. The circuit package of claim 1, wherein the circuit package comprises a first brace and a second brace, each brace positioned between the first and second circuit boards and coupling the first circuit board to the second circuit board, the first and second braces are operable to function as a flexible spacer between the first and second circuit boards.

6. The circuit package of claim 1, further comprising:
    a plurality of electrically conductive leads adapted to mount the circuit package on an external surface, and configured to support the circuit package in an upright position relative to the external surface.

7. The circuit package of claim 1, wherein the housing is made from an injected molded plastic.

8. The circuit package of claim 1, further comprising:
    an H-bridge circuit mounted on at least one of the first and second circuit boards.

9. The circuit package of claim 8, wherein the H-bridge circuit comprises:
    a first leg including a first lead and a first output node, and a first switch coupled therebetween;
    a second leg including a second lead and a second output node, and a second switch coupled therebetween;
    a third leg including the first lead and the second output node, and a third switch coupled therebetween;
    a fourth leg including the second lead and the first output node, and a forth switch coupled therebetween.

10. A circuit package for an electronic device, comprising:
    a first circuit board positioned in a first plane;
    a second circuit board positioned in a second plane and in contact with the first circuit board;
    at least one brace coupled to the first circuit board and the second circuit board;
    a plurality of electrically conductive leads extending from the circuit package and adapted to mount the circuit package on an external surface; and
    a housing formed to surround at least a portion of the first and second circuit boards; a plurality of components mounted on the first and second circuit boards in a region that is surrounded by the housing.

11. The circuit package of claim 10, wherein the housing forms a surface between at least two electrically conductive leads of the circuit package, wherein the surface of the circuit package comprises a cavity formed therein.

12. The circuit package of claim 10, wherein the first and second circuit boards are made of a single-sided direct bonded copper substrate.

13. The circuit package of claim 10, wherein the brace is an electrical conductor.

14. The circuit package of claim 10, wherein the housing is made from an injected molded plastic.

15. The circuit package of claim 10, further comprising an H-bridge circuit mounted on at least one of the first and second circuit board.

16. The circuit package of claim 15, wherein the H-bridge circuit comprises:
   a first leg including a first lead and a first output node, and a fist switch coupled therebetween;
   a second leg including a second lead and a second output node, and a second switch coupled therebetween;
   a third leg including the first lead and the second output node, and a third switch coupled therebetween;
   a fourth leg including the second lead and the first output node, and a fourth switch coupled therebetween.

17. A method of manufacturing a circuit package comprising the steps of:
   positioning a first circuit board in a first plane;
   positioning a second circuit board in a second plane;
   coupling at least two brace members to the first and second circuit boards;
   mounting at least two electrically conductive leads to at least one of the first and second circuit boards; and
   injecting a molding material between the first and second circuit boards to form a housing that substantially covers at least one surface of each of the circuit boards and leaves another surface of each circuit board substantially uncovered to thereby expose at least one surface of the first and second circuit boards.

18. The method of claim 17, further comprising the step of:
   coupling the plurality of conductive leads to the first and second circuit boards.

* * * * *

UNITED STATES PATENT AND TRADEMARK OFFICE
CERTIFICATE OF CORRECTION

PATENT NO. : 6,885,562 B2
DATED : April 26, 2005
INVENTOR(S) : McIlnay et al.

It is certified that error appears in the above-identified patent and that said Letters Patent is hereby corrected as shown below:

Column 9,
Line 65, delete "packages" and add -- package --.

Column 10,
Line 1, delete "pads" and add -- package --.
Line 5, delete "single sided" and add -- single-sided --.
Lines 54-56, delete "; a plurality of components mounted on the first and second circuit boards in a region that is surrounded by the housing"

Column 11,
Line 3, delete "board" and add -- boards --.

Signed and Sealed this

Twenty-eighth Day of June, 2005

JON W. DUDAS
*Director of the United States Patent and Trademark Office*